(12) United States Patent
Kawamoto

(10) Patent No.: US 9,793,907 B2
(45) Date of Patent: Oct. 17, 2017

(54) RESONATOR, PHASE-LOCKED LOOP, AND SEMICONDUCTOR INTEGRATED CIRCUIT DEVICE

(71) Applicant: HITACHI, LTD., Chiyoda-ku, Tokyo (JP)

(72) Inventor: Takashi Kawamoto, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 14/901,914

(22) PCT Filed: Nov. 7, 2013

(86) PCT No.: PCT/JP2013/080113
§ 371 (c)(1),
(2) Date: Dec. 29, 2015

(87) PCT Pub. No.: WO2015/068235
PCT Pub. Date: May 14, 2015

(65) Prior Publication Data
US 2016/0315627 A1    Oct. 27, 2016

(51) Int. Cl.
H03L 7/06 (2006.01)
H03L 7/10 (2006.01)
H03B 5/12 (2006.01)
H03L 7/083 (2006.01)
H03L 7/089 (2006.01)
H03L 7/099 (2006.01)

(52) U.S. Cl.
CPC .......... *H03L 7/102* (2013.01); *H03B 5/1212* (2013.01); *H03B 5/1228* (2013.01); *H03B 5/1265* (2013.01); *H03L 7/083* (2013.01); *H03L 7/0891* (2013.01); *H03L 7/099* (2013.01); *H03B 2200/0038* (2013.01); *H03B 2201/011* (2013.01)

(58) Field of Classification Search
None
See application file for complete search history.

(56) References Cited

U.S. PATENT DOCUMENTS

| | | |
|---|---|---|
| 2007/0030079 A1 | 2/2007 | Kawamoto et al. |
| 2008/0048795 A1 | 2/2008 | Hoshino et al. |
| 2008/0284524 A1 | 11/2008 | Kushiyama |
| 2009/0153204 A1 | 6/2009 | Kawamoto et al. |

(Continued)

FOREIGN PATENT DOCUMENTS

| | | |
|---|---|---|
| JP | 2002-368609 A | 12/2002 |
| JP | 2007-049277 A | 2/2007 |

(Continued)

OTHER PUBLICATIONS

Office Action dated Jul. 4, 2017 for related Japanese Application No. 2015-546202.

*Primary Examiner* — Lincoln Donovan
*Assistant Examiner* — Khareem E Almo
(74) *Attorney, Agent, or Firm* — Miles & Stockbridge P.C.

(57) ABSTRACT

A resonator is supplied with voltage from a constant-voltage source, and the constant-voltage source outputs output voltage adjusted by a voltage adjustment signal to the resonator. The resonator outputs a clock signal having a frequency varied by varying capacitance in accordance with a received control signal and a frequency adjustment signal, and a frequency of the clock signal is varied by voltage output from the constant-voltage source.

7 Claims, 18 Drawing Sheets

(56) References Cited

U.S. PATENT DOCUMENTS

| | | | |
|---|---|---|---|
| 2010/0244968 A1 | 9/2010 | Tsukizawa | |
| 2012/0081188 A1* | 4/2012 | Liu | H03L 1/023 |
| | | | 331/179 |
| 2013/0063219 A1* | 3/2013 | Shanan | H03B 1/04 |
| | | | 331/117 FE |
| 2013/0154752 A1* | 6/2013 | Lu | H03B 5/1228 |
| | | | 331/117 FE |
| 2013/0181783 A1* | 7/2013 | Upadhyaya | H03B 5/1228 |
| | | | 331/117 FE |
| 2013/0257547 A1 | 10/2013 | Arai et al. | |
| 2016/0099678 A1* | 4/2016 | Kong | H03L 7/103 |
| | | | 331/117 R |
| 2016/0315627 A1* | 10/2016 | Kawamoto | H03B 5/1228 |

FOREIGN PATENT DOCUMENTS

| | | |
|---|---|---|
| JP | 2008-053784 A | 3/2008 |
| JP | 2008-219513 A | 9/2008 |
| JP | 2010-081512 A | 4/2010 |
| JP | 2010-239527 A | 10/2010 |
| JP | 2013-026712 A | 2/2013 |
| JP | 2013-26881 A | 2/2013 |
| JP | 2013-214798 A | 10/2013 |

* cited by examiner

FIG. 11C

| $S_{WCOM}$ | $S_{COM1}$ | $S_{COM}$ |
|---|---|---|
| 1 | 0 | 1 |
| 0 | 0 | 0 |
| 1 | 1 | −1 |

US 9,793,907 B2

RESONATOR, PHASE-LOCKED LOOP, AND SEMICONDUCTOR INTEGRATED CIRCUIT DEVICE

TECHNICAL FIELD

The present invention relates to a resonator used in a phase-locked loop.

BACKGROUND ART

Generally in a semiconductor integrated circuit device, a phase-locked loop is mounted in order to generate a processing clock of a logic circuit or generate a transmission signal clock. The phase-locked loop (PLL) mounted on the semiconductor integrated circuit device includes an analog circuit (particularly, voltage-controlled oscillator (VCO)). Therefore, a calibration technology of performing automatic adjustment such that the PLL satisfies desired characteristics is known.

For example, JP 2008-219513 A discloses a PLL calibration technology.

SUMMARY OF INVENTION

Technical Problem

A PLL needs to have a calibration function by which adjustment is performed such that a semiconductor integrated circuit device satisfies desired characteristics. Further, in the semiconductor integrated circuit device mounted on a communication device, an operation frequency of the PLL needs to be changed in accordance with change of a communication speed.

In the case of using an LC resonator as a voltage-controlled oscillator in the PLL, calibration to select a resonance frequency band of the LC resonator is needed in order to establish desired PLL operation. However, the LC resonator normally has a narrow frequency variable range and hardly outputs a signal having a broadband frequency.

In recent years, a communication speed is becoming so fast that change of an output frequency of a PLL can be hardly handled by the frequency variable range of the LC resonator.

According to the calibration technology in the related arts, there is a technology to compensate PLL operation by adjusting output voltage of an LDO in accordance with change of a reference clock frequency during a test as disclosed in PTL 1.

However, the calibration technology in the related arts can merely perform slight adjustment for a VCO variable range by increasing or decreasing the reference clock frequency. Therefore, it may be difficult to control, for example, to change a frequency of the PLL output frequency by an external signal.

An object of the present invention is to provide an LCVCO that operates in a broad frequency range.

Another object of the present invention is to provide a PLL capable of adjusting a lock frequency in a broad range by control from the outside.

Still another object of the present invention is to provide an interface device capable of operating in a broad frequency range.

Solution to Problem

Typical examples of the invention disclosed in the present application will be described below. More specifically, a resonator is supplied with voltage from a constant-voltage source, and the constant-voltage source outputs, to the resonator, output voltage adjusted by a voltage adjustment signal. The resonator outputs a clock signal having a frequency varied by varying capacitance in accordance with a received control signal and a frequency adjustment signal, and a frequency of the clock signal is varied by voltage output from the constant-voltage source.

Advantageous Effects of Invention

According to the typical embodiments of the present invention, a resonator having a broad oscillation frequency range can be provided. Other problems, configurations and advantageous effects will be apparent from the following description of embodiments.

BRIEF DESCRIPTION OF DRAWINGS

FIG. 11C is an explanatory diagram for an exemplary configuration of a truth table used by a logic unit according to the second embodiment.

DESCRIPTION OF EMBODIMENTS

In the following, preferable embodiments of the present invention will be described with reference to the attached drawings.

First Embodiment

First, a first embodiment of an LC resonator (LCVCO) according to the present invention will be described by using FIGS. 1 to 5.

Figure 1:
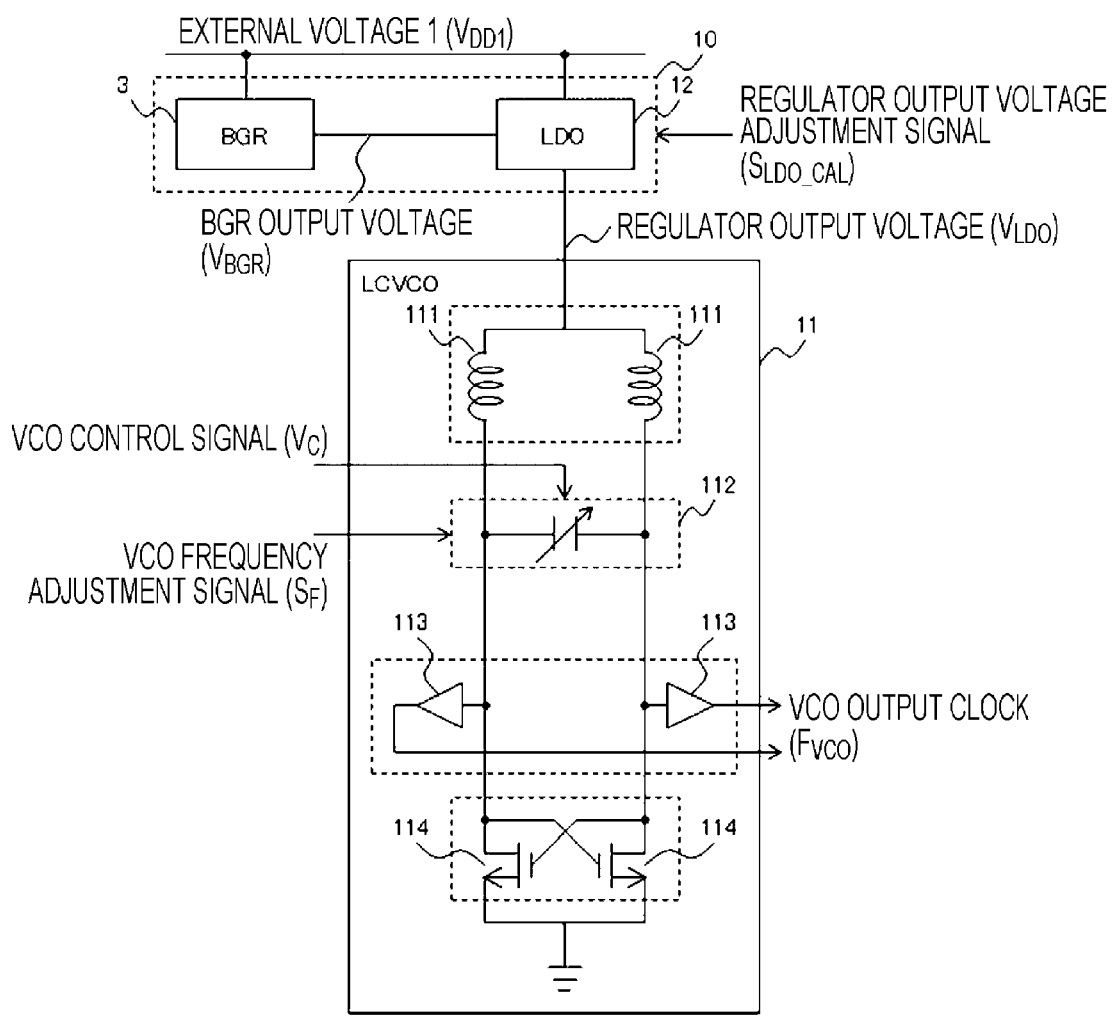
FIG. 1 is a diagram illustrating an exemplary configuration of an LCVCO and a peripheral circuit according to a first embodiment.

FIG. 1 is a diagram illustrating an exemplary configuration of the LCVCO 11 and a peripheral circuit according to the present embodiment.

In the present embodiment, a constant-voltage source 10 and an LC resonator (LCVCO) 11 are provided.

The constant-voltage source 10 includes a band gap reference (BGR) 3 and a regulator 12. The regulator 12 outputs, as power-supply voltage of the LCVCO 11, regulator output voltage ($V_{LDO}$) adjusted by received BGR output voltage ($V_{BGR}$) and a regulator output voltage adjustment signal ($S_{LDO\_CAL}$).

The LCVCO 11 has a function to output a VCO clock ($F_{VCO}$) having a frequency in accordance with the received regulator output voltage ($V_{LDO}$), a VCO control signal ($V_C$), and a VCO frequency adjustment signal ($S_F$).

In the LCVCO 11, the regulator output voltage ($V_{LDO}$) is branched into two, and each of the branched voltage is received in a terminal on one side of each of inductances 111, 111. Capacitance 112 is connected between terminals on the other side of the inductances 111, 111. The capacitance 112 can change a capacitance value by the VCO control signal ($V_C$) and the VCO frequency adjustment signal ($S_F$).

Further, a VCO output clock ($F_{VCO}$) that is a sine wave having a reverse phase relation is output from each of the terminals on the other side of the inductances 111, 111 via a buffer 113. Therefore, the buffer 113 is connected to only the terminal of one inductance 111, and the clock may be output only from a path on one side.

Further, the respective terminals on the other side of the inductances 111, 111 are connected to drain terminals of transistors 114, 114. A source terminal of each of the transistors 114 is connected to the ground. A gate terminal of each of the transistors 114 is connected to the terminal on the other side of the inductance 111 on the opposite side, and receives a signal having a reverse phase.

By forming the LCVCO 11 as illustrated, the clock that is varied from zero to a range of the power-supply voltage can be output. This signal inevitably crosses a level determination threshold in the power-supply voltage. Therefore, a useful signal can be output regardless of a subsequent stage configuration.

In the illustrated embodiment, a MOSFET is used for the transistor 114, but a bipolar transistor may also be used.

Figure 2:
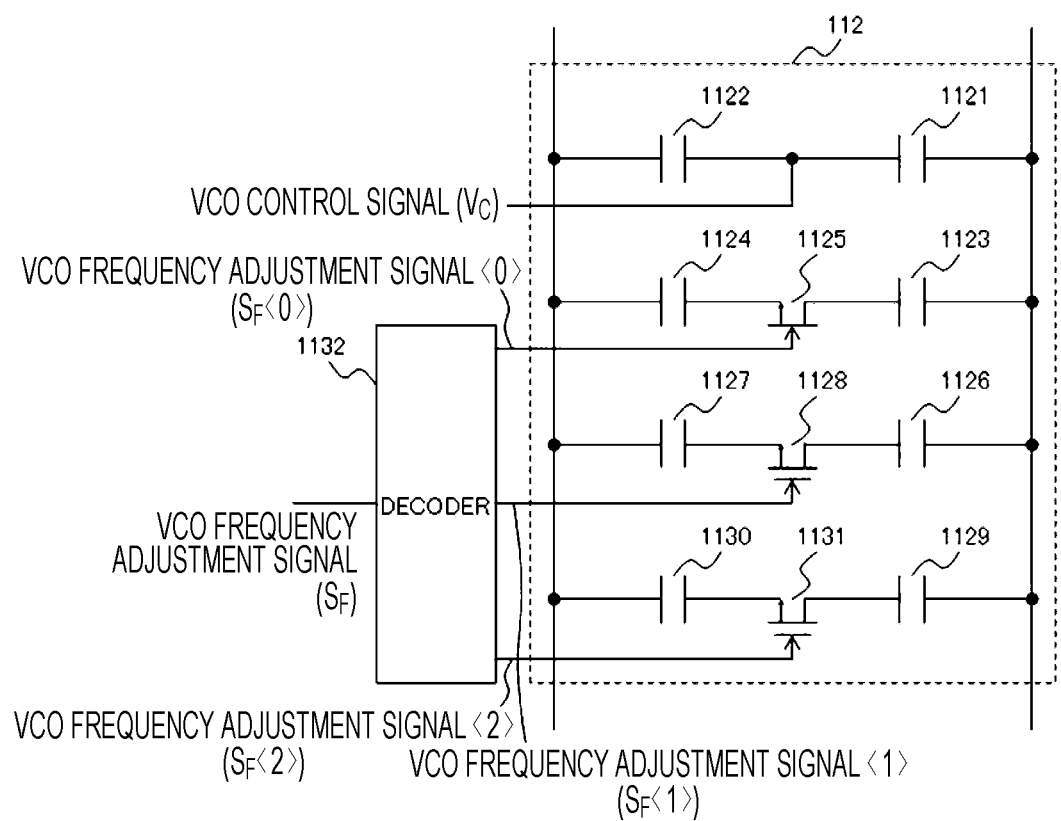
FIG. 2 is a diagram illustrating an exemplary configuration of capacitance of the LCVCO according to the first embodiment.

FIG. 2 is a diagram illustrating an exemplary configuration of the capacitance 112 according to the present embodiment.

The capacitance 112 receives the VCO control signal ($V_C$) and the VCO frequency adjustment signal ($S_F$). The capacitance 112 is formed of varactors 1121, 1122, switches 1125, 1128, 1131, and capacitance 1123, 1124, 1126, 1127, 1129, 1130.

The varactors 1121, 1122 are diodes in which a capacitance value is varied by a voltage value of the VCO control signal ($V_C$). A selecting state of the capacitance 1123, 1124, 1126, 1127, 1129, 1130 is changed by switching ON/OFF of the switches 1125, 1128, 1131 in accordance with a value of the VCO frequency adjustment signal ($S_F$). By this, a capacitance value in the entire capacitance 112 is changed in accordance with the VCO control signal ($V_C$) and the VCO frequency adjustment signal ($S_F$). According to the embodiment illustrated, a MOSFET is used for the switches 1125, 1128, 1131, but a bipolar transistor may also be used.

The VCO frequency adjustment signal ($S_F$) is decomposed by a decoder 1132 into a plurality of VCO frequency adjustment signals <0:2> (SF <n>), and controls the respective switches 1125, 1128, 1131. By this control, an oscillation frequency of the LCVCO 11 can be changed by the VCO control signal ($V_C$) and the VCO frequency adjustment signal ($S_F$).

Note that the configuration of the capacitance 112 is not limited to the configuration illustrated in FIG. 2.

Figure 3:
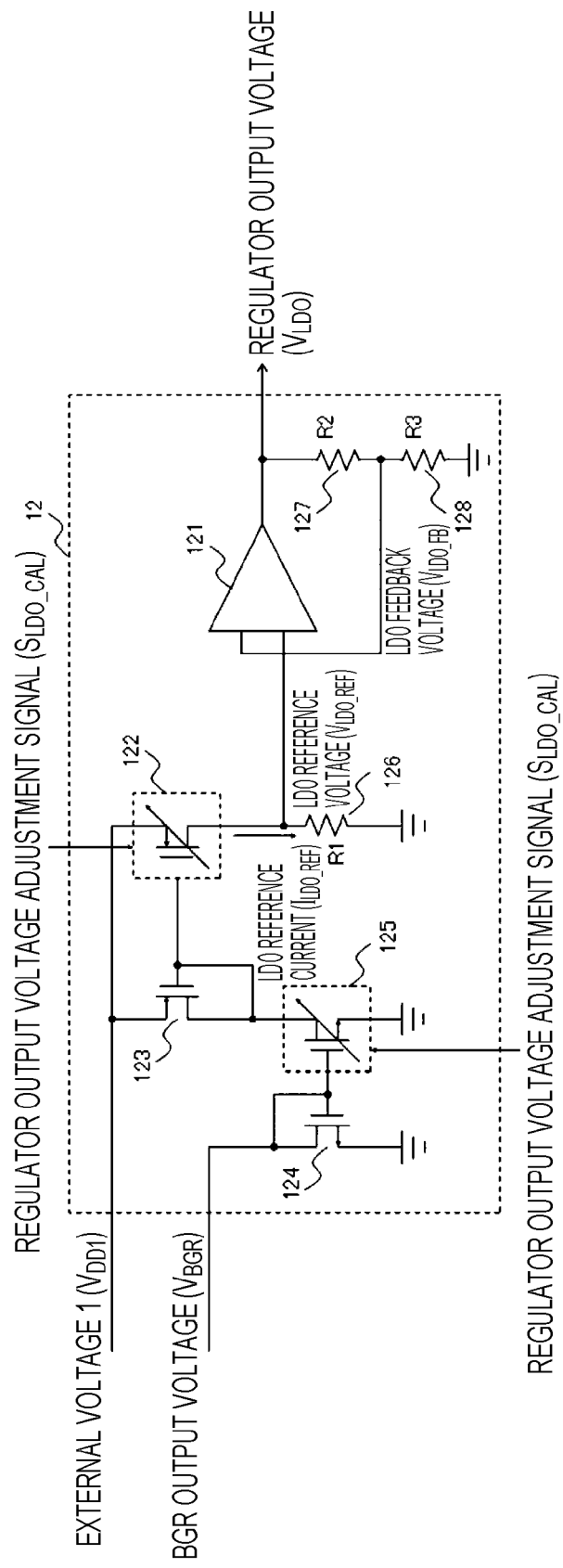
FIG. 3 is an explanatory diagram for a first exemplary configuration of a regulator according to the first embodiment.

FIG. 3 is an explanatory diagram for a first exemplary configuration of the regulator 12.

The regulator 12 having the first exemplary configuration is formed of transistors 122, 123, 124, 125, resistances 126, 127, 128, and an operational amplifier 121.

The transistors 122, 123, 124, 125 constitute a current mirror circuit in which LDO reference current ($I_{LDO\_REF}$) corresponding to drain current of the MOS 122 is generated by distributing, at a setting current mirror ratio, current that flows from the BGR output voltage ($V_{BGR}$) and then flows to the ground via the transistor 124. The current mirror ratio of the current mirror circuit is set by the regulator output voltage adjustment signal ($S_{LDO\_CAL}$). The LDO reference current ($I_{LDO\_REF}$) is received in the resistance (R1) 126, and LDO reference voltage ($V_{LDO\_REF}$) is generated. The generated LDO reference current ($I_{LDO\_REF}$) is received in the operational amplifier 121.

The operational amplifier 121 performs feedback control such that potential of the LDO reference voltage ($V_{LDO\_REF}$) becomes same as the potential of LDO feedback voltage ($V_{LDO\_FB}$) divided by the resistance (R2) 127 and the resistance (R3) 128 of the regulator output voltage ($V_{LDO}$). When the operational amplifier 121 is stabilized by this feedback control, the regulator output voltage ($V_{LDO}$) can be expressed by the following formulas.

$$V_{LDO} = V_{LDO\_FB}((R2+R3)/R3)$$

$$= V_{LDO\_REF}((R2+R3)/R3)$$

$$= I_{LDO\_REF}(R1)((R2+R3)/R3)$$

At this point, the LDO reference current ($I_{LDO\_REF}$) can be changed by the regulator output voltage adjustment signal ($S_{LDO\_CAL}$), and the regulator output voltage ($V_{LDO}$) can be changed. Note that the regulator 12 is not limited to the configuration illustrated in FIG. 3 as long as the same operation as the first exemplary configuration can be performed.

FIGS. 4A, 4B, 5A, and 5B are explanatory diagrams for operation characteristics of the LCVCO 11.

Figure 4A:
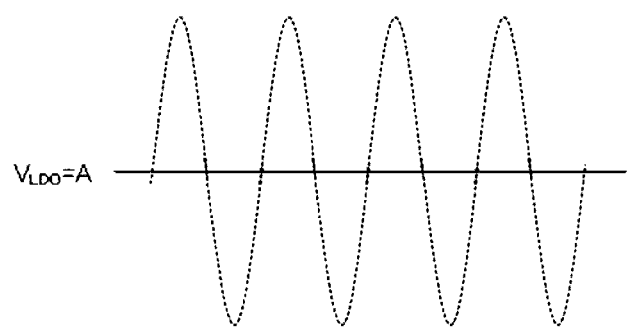
FIG. 4A is an explanatory diagram for operation characteristics of the LCVCO according to the first embodiment.
Figure 4B:
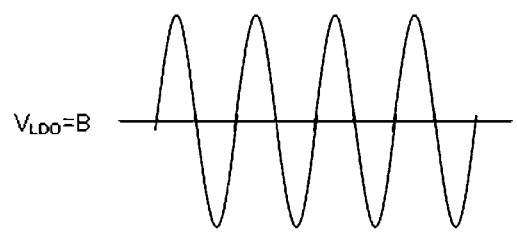
FIG. 4B is an explanatory diagram for operation characteristics of the LCVCO according to the first embodiment.

The LCVCO 11 operates by using the regulator output voltage ($V_{LDO}$) as the power-supply voltage, and the frequency is changed when the regulator output voltage ($V_{LDO}$) is changed. The LCVCO 11 performs oscillation operation to output sin waves at amplitude corresponding to the regulator output voltage ($V_{LDO}$) by centering the regulator output voltage ($V_{LDO}$). At this point, a time constant of the LCVCO 11 does not change. Therefore, as illustrated in FIGS. 4A and 4B, the lower the regulator output voltage ($V_{LDO}$) is, the faster the oscillation frequency is.

Figure 5A:
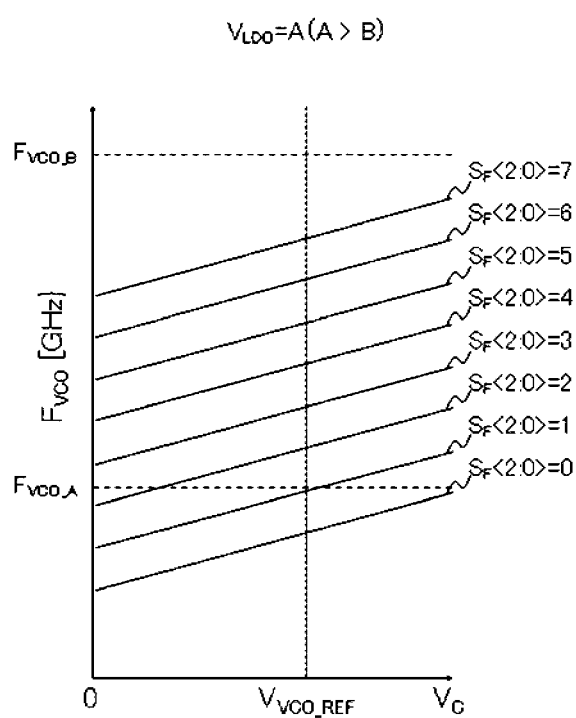
FIG. 5A is an explanatory diagram for frequency characteristics of the LCVCO according to the first embodiment.
Figure 5B:
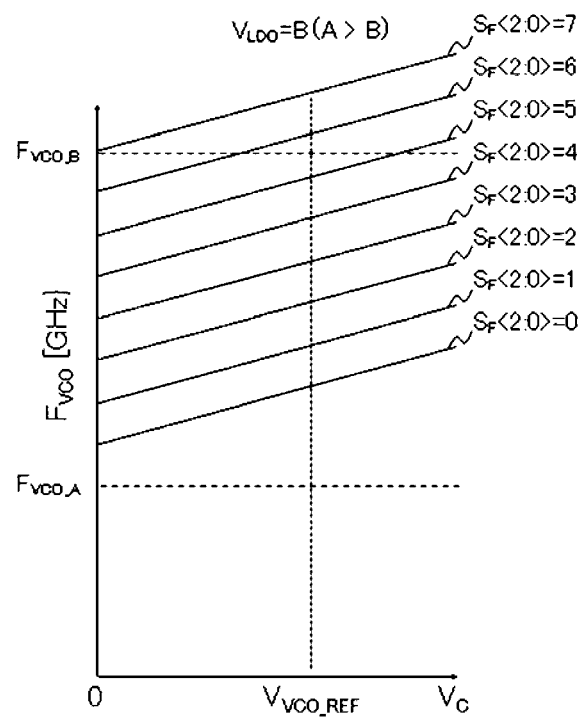
FIG. 5B is an explanatory diagram for frequency characteristics of the LCVCO according to the first embodiment.

FIGS. 5A and 5B illustrate frequency characteristics of the LCVCO 11.

When A is larger than B, the oscillation frequency of the LCVCO 11 becomes faster in the regulator output voltage ($V_{LDO}$)=B. For example, in the case where target values of the oscillation frequency of the LCVCO 11 are $F_{VCO\_A}$ and $F_{VCO\_B}$, a frequency variable range of the LCVCO 11 cannot cover both $F_{VCO\_A}$ and $F_{VCO\_B}$. Therefore, in the case of outputting $F_{VCO\_A}$, the regulator output voltage ($V_{LDO}$) is set at A, and in the case of outputting $F_{VCO\_B}$, the regulator output voltage ($V_{LDO}$) is set at B. By this, the LCVCO 11 can be operated in the frequency range larger than the frequency variable range that the LCVCO 11 originally has.

Figure 6:
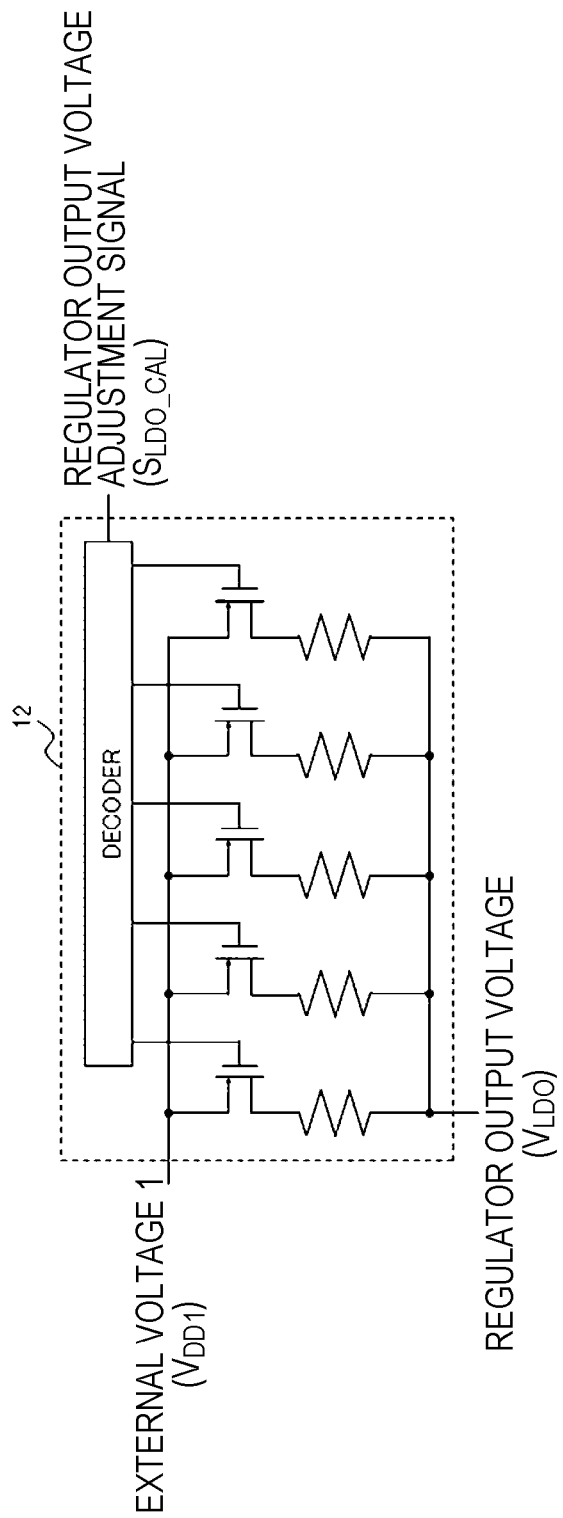
FIG. 6 is an explanatory diagram for a second exemplary configuration of a regulator according to the first embodiment.

FIG. 6 is an explanatory diagram for a second exemplary configuration of the regulator 12.

The regulator 12 of the second exemplary configuration is formed of switches and resistances, and receives the regulator output voltage adjustment signal ($S_{LDO\_CAL}$). The received regulator output voltage adjustment signal ($S_{LDO\_CAL}$) is decomposed by a decoder into a plurality of regulator output voltage adjustment signals <4:0> ($S_{LDO\_CAL}$), and controls the respective switches. In the case where the switch is turned ON by this control, a resistance is selected, and a resistance value of the regulator 12 is changed in accordance with a value of the regulator output voltage adjustment signal ($S_{LDO\_CAL}$). When the resistance value is changed, the regulator output voltage ($V_{LDO}$) determined by IR drop of the operation current of the LCVCO 11 is changed, and an operation frequency of the LCVCO 11 is changed.

Due to this, the oscillation frequency of the LCVCO 11 is changed by the regulator output voltage adjustment signal ($S_{LDO\_CAL}$). Note that the regulator 12 is not limited to the configuration illustrated in FIG. 6 as long as the same operation as the second exemplary configuration is achieved.

As described above, according to the first embodiment, the oscillation frequency range of the LCVCO by LC resonance having a narrow resonance frequency can be broaden by adjusting the LDO output voltage.

Second Embodiment

Figure 7:
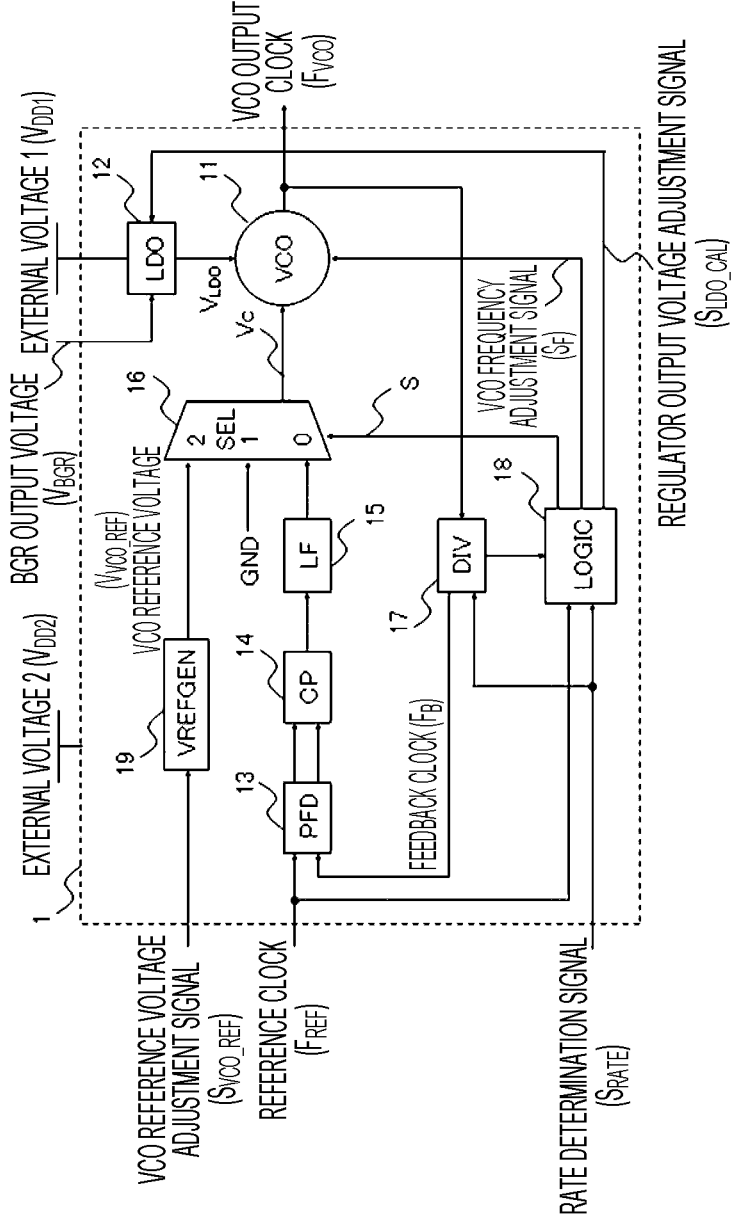
FIG. 7 is an explanatory diagram for an exemplary configuration of a PLL according to a second embodiment.

An embodiment of a phase-locked loop (PLL) according to the present invention will be described. FIG. 7 is an explanatory diagram for an exemplary configuration of the PLL according to a second embodiment.

The PLL illustrated in FIG. 7 includes a phase frequency comparator 13, a charge pump 14, a loop filter 15, a voltage selector 16, an LCVCO 11, a regulator 12, a frequency divider 17, and a logic unit 18.

The phase frequency comparator 13 compares a reference clock ($F_{REF}$) with a feedback clock ($F_B$) output from the frequency divider 17 in which a frequency dividing number is set by a rate determination signal ($S_{RATE}$), and outputs a phase difference signal. The phase difference signal thus output is received in the LCVCO 11 as VCO control voltage ($V_C$) via the charge pump 14, loop filter 15, and voltage selector 16. A frequency and a phase of a VCO output clock ($F_{VCO}$) output from the LCVCO 11 are controlled to predetermined values by the VCO control voltage ($V_C$).

The logic unit 18 generates a regulator output voltage adjustment signal ($S_{LDO\_CAL}$) based on an output signal from the frequency divider 17, reference clock ($F_{REF}$) and the rate determination signal ($S_{RATE}$), and outputs the same to the regulator 12, and then adjusts regulator output voltage ($V_{LDO}$). Further, the logic unit 18 generates a VCO frequency adjustment signal ($S_F$) based on the output signal from the frequency divider 17, reference clock ($F_{REF}$), and rate determination signal ($S_{RATE}$), and outputs the same to the LCVCO 11. In this manner, the logic unit 18 has an adjustment function such that the frequency of the VCO output clock ($F_{VCO}$) becomes within a predetermined frequency range.

Figure 8:
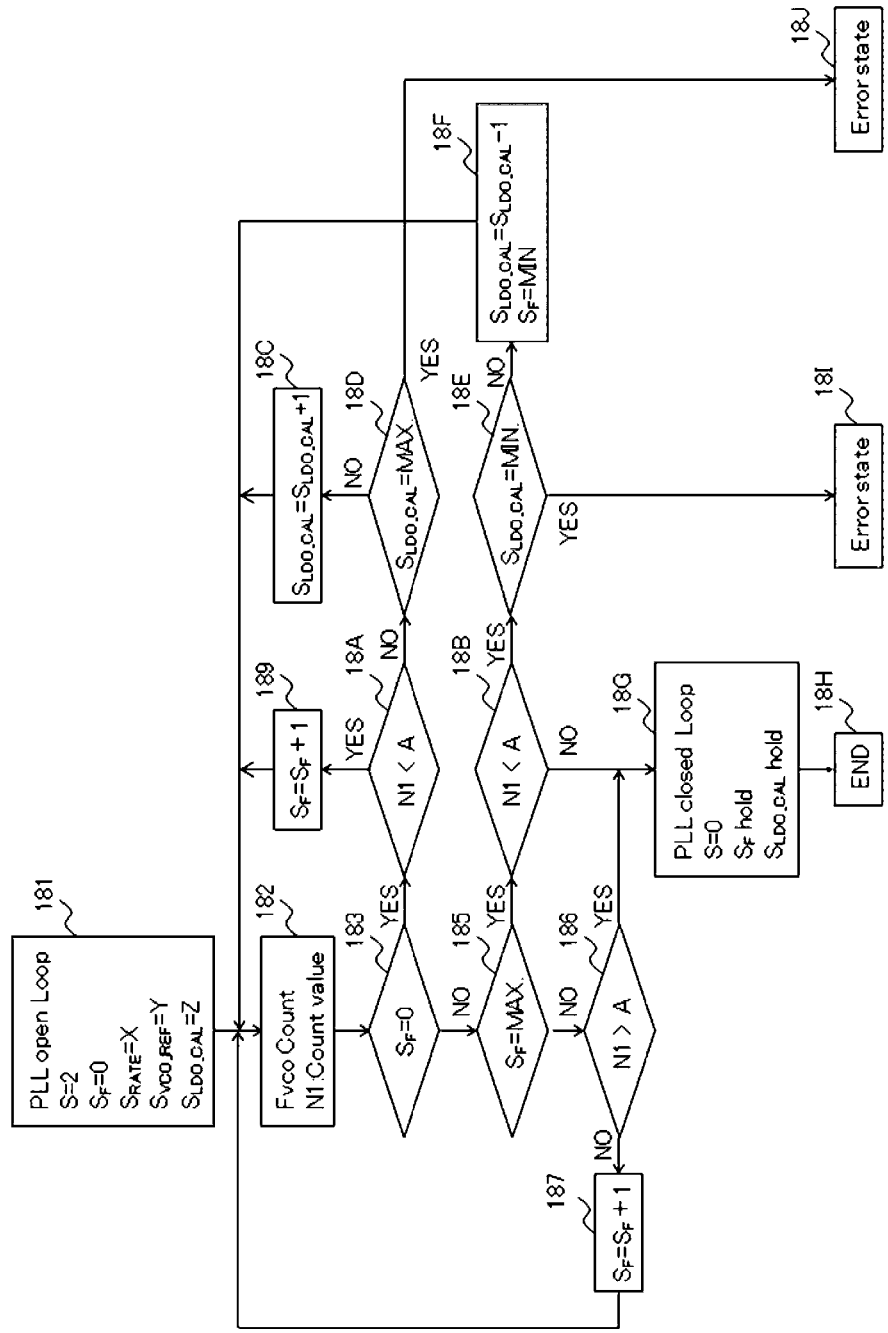
FIG. 8 is a flowchart to describe calibration operation of the PLL according to the second embodiment.

A calibration method to adjust the frequency of the VCO output clock ($F_{VCO}$) will be described by using FIGS. 7 and 8.

In an initial state 181, the PLL is an open loop. In other words, the VCO reference voltage ($V_{VCO\_REF}$) is in a state of being selected as the VCO control signal ($V_C$) by setting the voltage selector 16 as S=2. A reference voltage generation unit 19 generates the VCO reference voltage ($V_{VCO\_REF}$) from a received VCO reference voltage adjustment signal ($S_{VCO\_REF}$). Further, the rate determination signal ($S_{RATE}$) is set as a predetermined value X, the VCO reference voltage adjustment signal ($S_{VCO\_REF}$) is set as a predetermined value Y, and the regulator output voltage adjustment signal ($S_{LDO\_CAL}$) is set as a predetermined value Z.

In this state, the logic unit 18 counts an output signal of the frequency divider 17, and calculates a count result N1 (182). Note that a count time is generated from the reference clock ($F_{REF}$).

In the case where the VCO frequency adjustment signal ($S_F$) is zero (YES in 183) and the count result N1 is smaller than a target value A (YES in 18A), the frequency of the VCO output clock ($F_{VCO}$) is lower than a target frequency. Therefore, the VCO frequency adjustment signal ($S_F$) is incremented to increase the frequency of the VCO output clock ($F_{VCO}$) (189). Further, the logic unit 18 counts an output signal of the frequency divider 17 (182).

In the case where the count result N1 is larger than the target value A (NO in 18A), the frequency of the VCO output clock ($F_{VCO}$) is higher than the target frequency. Therefore, the frequency of the VCO output clock ($F_{VCO}$) needs to be delayed. In the case where the regulator output voltage adjustment signal ($S_{LDO\_CAL}$) is not a maximum value (NO in 18D), the regulator output voltage adjustment signal ($S_{LDO\_CAL}$) is incremented to decrease the frequency of the VCO output clock ($F_{VCO}$) (18C). Further, the logic unit 18 counts an output signal of the frequency divider 17 (182).

In the case where the regulator output voltage adjustment signal ($S_{LDO\_CAL}$) is the maximum value (YES in 18D), the frequency of the VCO output clock ($F_{VCO}$) cannot be increased any further by adjusting the VCO frequency adjustment signal ($S_F$) and the regulator output voltage adjustment signal ($S_{LDO\_CAL}$). Therefore, the calibration processing shifts to an error state and ends abnormally (18J).

In the case where: the VCO frequency adjustment signal ($S_F$) is not zero (NO in 183); the VCO frequency adjustment signal ($S_F$) is not the maximum value (NO in 185); and the count result N1 is smaller than the target value A (NO in 186), the VCO frequency adjustment signal ($S_F$) is incremented to increase the frequency of the VCO output clock ($F_{VCO}$) (187). Further, the logic unit 18 counts an output signal of the frequency divider (182).

In the case where the VCO frequency adjustment signal ($S_F$) is the maximum value (YES in 185) and the count result N1 is larger than the target value A (NO in 18B), the PLL is made to a closed loop and the VCO frequency adjustment signal ($S_F$) and the regulator output voltage adjustment signal ($S_{LDO\_CAL}$) at this point are maintained (18G) as they are, and then the calibration processing ends normally (18H).

In the case where the VCO frequency adjustment signal ($S_F$) is the maximum value (YES in 18S) and the count result N1 is smaller than the target value A (YES in 18B), the frequency of the VCO output clock ($F_{VCO}$) cannot be increased any further by adjusting the VCO frequency adjustment signal ($S_F$) and the regulator output voltage adjustment signal ($S_{LDO\_CAL}$) when the regulator output voltage adjustment signal ($S_{LDO\_CAL}$) is a minimum value (YES in 18E). Therefore, the calibration processing shifts to the error state and ends abnormally (18I).

When the regulator output voltage adjustment signal ($S_{LDO\_CAL}$) is not the minimum value (NO in 18E), the regulator output voltage adjustment signal ($S_{LDO\_CAL}$) is decremented and the VCO frequency adjustment signal ($S_F$) is set at a minimum value (18F). Further, the logic unit 18 counts an output signal of the frequency divider 17 (182).

As described above, according to the second embodiment, the oscillation frequency range of the LCVCO can be broadened by adjusting the LDO output voltage, and the PLL having a broad operation frequency range can be provided.

First Modified Example

Figure 9:
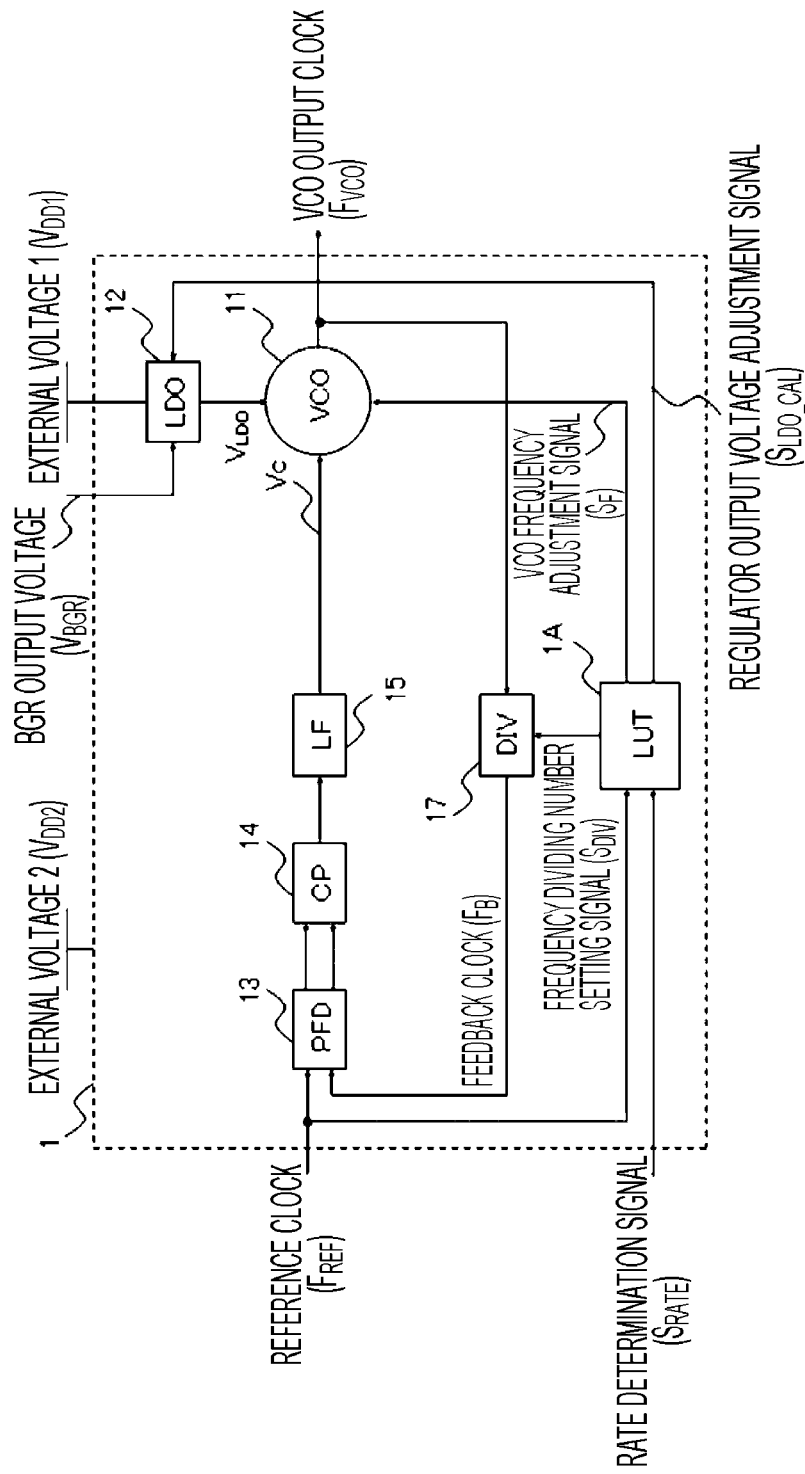
FIG. 9 is an explanatory diagram for a first modified example of the PLL according to the second embodiment.

Next, a first modified example of the second embodiment will be described. FIG. 9 is an explanatory diagram for the first modified example of the PLL according to the second embodiment.

The PLL illustrated in FIG. 9 includes the phase frequency comparator 13, the charge pump 14, the loop filter 15, the LCVCO 11, the regulator 12, the frequency divider 17, and a look-up table 1A.

The phase frequency comparator 13 compares the reference clock ($F_{REF}$) with the feedback clock ($F_B$) output from the frequency divider 17 in which a frequency dividing number is set by the rate determination signal ($S_{RATE}$), and outputs the phase difference signal. The output phase difference signal is received in the LCVCO 11 as the VCO control voltage ($V_C$) via the charge pump 14 and the loop filter 15. The frequency and the phase of the VCO output clock ($F_{VCO}$) output from the LCVCO 11 are controlled to predetermined values by the VCO control voltage ($V_C$).

The look-up table 1A holds values of the VCO frequency adjustment signal ($S_F$), the regulator output voltage adjustment signal ($S_{LDO\_CAL}$), and a frequency dividing number setting signal ($S_{DIV}$) in order to achieve the frequency of the VCO output clock ($F_{VCO}$) determined from the rate determination signal ($S_{RATE}$), and outputs the predetermined values to the LCVCO 11 and the regulator 12.

More specifically, the look-up table 1A determines the regulator output voltage adjustment signal ($S_{LDO\_CAL}$) from the reference clock ($F_{REF}$) and the rate determination signal ($S_{RATE}$), and outputs the same to the regulator 12, and then adjusts the regulator output voltage ($V_{LDO}$). Further, the look-up table 1A determines the VCO frequency adjustment signal ($S_F$) from the reference clock ($F_{REF}$) and the rate determination signal ($S_{RATE}$), and outputs the same to the LCVCO 11. Furthermore, the look-up table 1A determines the frequency dividing number setting signal ($S_{DIV}$) from the reference clock ($F_{REF}$) and the rate determination signal ($S_{RATE}$), and outputs the same to the frequency divider 17. By this, the look-up table 1A adjusts the frequency of the VCO output clock ($F_{VCO}$) so as to be within the predetermined frequency range, and has an adjustment function such that the frequency divider 17 operates at the predetermined frequency dividing number.

According to the PLL of the first modified example, there is an effect that there is no need to perform calibration in order to adjust the frequency of the VCO output clock ($F_{VCO}$).

Second Modified Example

Figure 10:
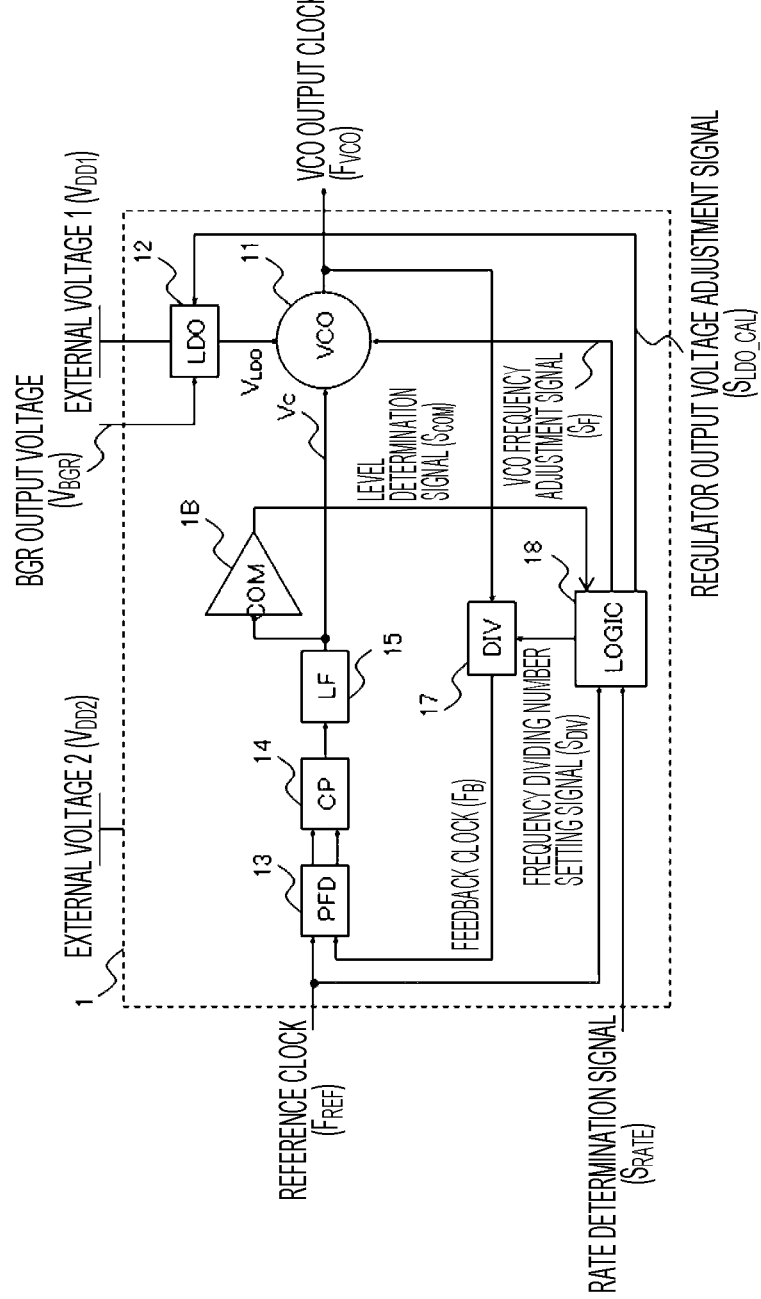
FIG. 10 is an explanatory diagram for a second modified example of the PLL according to the second embodiment.

Next, a second modified example of the second embodiment will be described. FIG. 10 is an explanatory diagram for the second modified example of the PLL according to the second embodiment.

The PLL illustrated in FIG. 10 includes the phase frequency comparator 13, the charge pump 14, the loop filter 15, a comparator 1B, the LCVCO 11, the regulator 12, the frequency divider 17, and the logic unit 18.

The phase frequency comparator 13 compares a reference clock ($F_{REF}$) with a feedback clock ($F_B$) output from the frequency divider 17 in which a frequency dividing number is set by a rate determination signal ($S_{RATE}$), and outputs a phase difference signal. The output phase difference signal is received in the LCVCO 11 as the VCO control voltage ($V_C$) via the charge pump 14 and the loop filter 15. A frequency and a phase of a VCO output clock ($F_{VCO}$) output from the LCVCO 11 are controlled to predetermined values by the VCO control voltage ($V_C$).

The comparator 1B receives the VCO control voltage ($V_C$) output from the loop filter 15, compares a value of the VCO control voltage ($V_C$) with a voltage threshold, and outputs a level determination signal ($S_{COM}$) to the logic unit 18.

The logic unit 18 determines the regulator output voltage adjustment signal ($S_{LDO\_CAL}$) from the level determination signal ($S_{COM}$), reference clock ($F_{REF}$), and rate determination signal ($S_{RATE}$), and outputs the same to the regulator 12, and then adjusts the regulator output voltage ($V_{LDO}$). Further, the logic unit 18 determines the VCO frequency adjustment signal ($S_F$) from the reference clock ($F_{REF}$) and the rate determination signal ($S_{RATE}$), and outputs the same to the LCVCO 11. Furthermore, the logic unit 18 determines the frequency dividing number setting signal ($S_{DIV}$) from the reference clock ($F_{REF}$) and the rate determination signal ($S_{RATE}$), and outputs the same to the frequency divider 17. By this, the logic unit 18 adjusts the frequency of the VCO output clock ($F_{VCO}$) so as to be within the predetermined frequency range, and has an adjustment function such that the frequency divider 17 operates at the predetermined frequency dividing number.

Figure 11A:
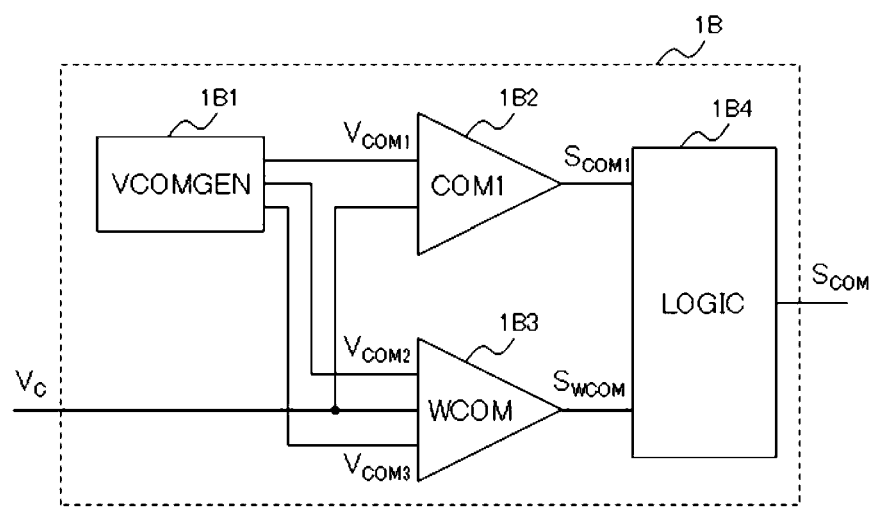
FIG. 11A is an explanatory diagram for an exemplary configuration of a comparator according to the second embodiment.
Figure 11B:
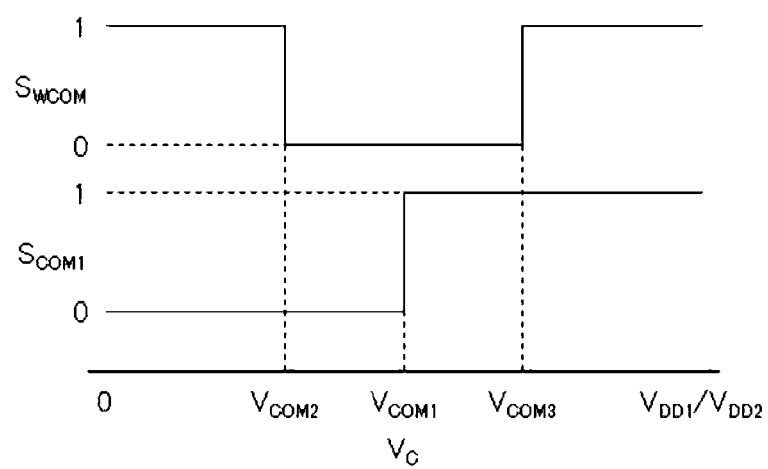
FIG. 11B is an explanatory diagram for output of the comparator according to the second embodiment.
Figure 11C:
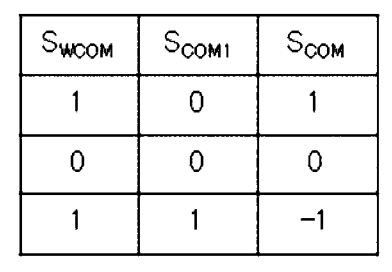

FIGS. 11A to 11C are explanatory diagrams for an exemplary configuration of the comparator 1B.

The comparator 1B includes a determination voltage generation circuit 1B1, a comparator 1B2, a window comparator 1B3, and a logic unit 1B4. The comparator 1B compares the value of VCO control voltage ($V_C$) with a comparator determination voltage ($V_{COM1}$, $V_{COM2}$, $V_{COM3}$) generated by the determination voltage generation circuit 1B1, and determines the VCO control voltage ($V_C$).

The comparator 1 (1B2) compares the comparator determination voltage ($V_{COM1}$) with the VCO control voltage ($V_C$), and outputs a comparator determination signal ($S_{COM1}$). More specifically, in the case where the VCO control voltage ($V_C$) is smaller than the comparator determination voltage ($V_{COM1}$), the comparator 1 (1B2) outputs a comparator determination signal ($S_{COM1}$)=0, and in the case of being larger, the comparator 1 (1B2) outputs a comparator determination signal ($S_{COM1}$)=1 (refer to FIG. 11B).

The window comparator 1B3 compares the comparator determination voltage ($V_{COM2}$, $V_{COM3}$) with the VCO control voltage ($V_C$), and outputs a window comparator determination signal ($S_{WCOM}$). More specifically, in the case where the VCO control voltage ($V_C$) is smaller or larger than the comparator determination voltage ($V_{COM2}$), a comparator determination signal ($S_{COM1}$)=1 is output. In the case where the VCO control voltage ($V_C$) is between the two comparator determination voltage ($V_{COM2}$, $V_{COM3}$), a comparator determination signal ($S_{COM1}$)=0 is output (refer to FIG. 11B).

The logic unit 1B4 receives the comparator determination signal ($S_{COM1}$) and the window comparator determination signal ($S_{WCOM}$), and outputs the level determination signal ($S_{COM}$) in accordance with a truth table illustrated in FIG. 11C.

Figure 12:
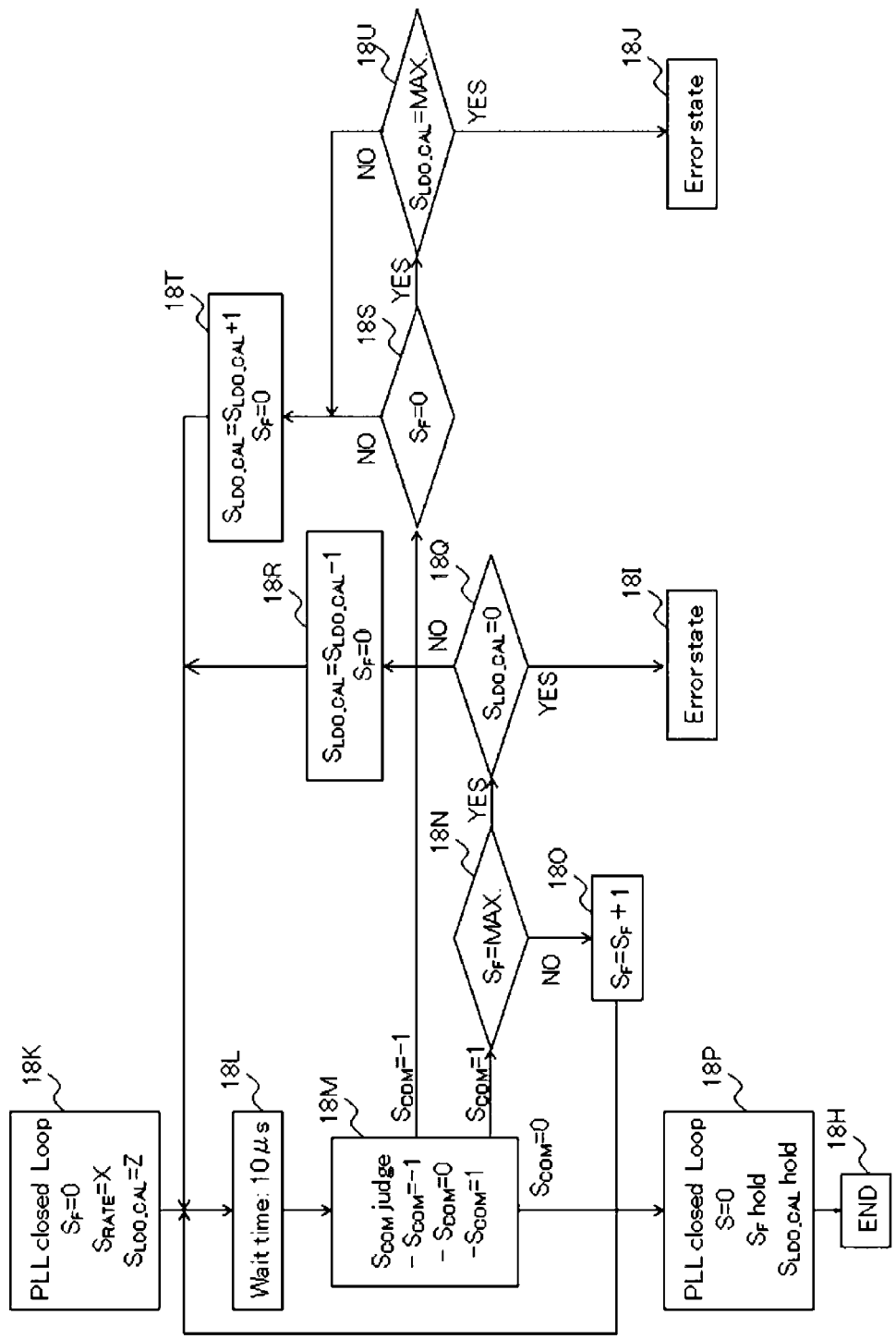
FIG. 12 is a flowchart to describe calibration operation of the PLL according to the second modified example of the second embodiment.

A calibration method to adjust the frequency of the VCO output clock ($F_{VCO}$) according to the second modified example of the second embodiment will be described by using FIG. 12.

In the initial state 18I, the PLL is a closed loop. The rate determination signal ($S_{RATE}$) is set as the predetermined value X, and the regulator output voltage adjustment signal ($S_{LDO\_CAL}$) is set as the predetermined value Z (18K).

The logic unit 18 waits for a predetermined period (18L). In the example illustrated in FIG. 12, the waiting time is set to 10 µs, but the waiting time is not limited thereto as long as it is enough time to lock the PLL.

Next, the logic unit 18 determines the level determination signal ($S_{COM}$) (18M). In the case where the level determination signal ($S_{COM}$) is zero, current values of the VCO frequency adjustment signal ($S_F$) and regulator output voltage adjustment signal ($S_{LDO\_CAL}$) are maintained (18P) as they are, and calibration normally ends (18H).

In the case where the level determination signal ($S_{COM}$) is −1 and the VCO frequency adjustment signal ($S_F$) is zero (YES in 18S) and further the regulator output voltage adjustment signal ($S_{LDO\_CAL}$) is the maximum value (YES in 18U), the calibration processing shifts to the error state and end abnormally (18J).

In the case where the VCO frequency adjustment signal ($S_F$) is not zero (NO in 18S) or in the case where the VCO frequency adjustment signal ($S_F$) is zero but the regulator output voltage adjustment signal ($S_{LDO\_CAL}$) is not the maximum value (NO in 18U), the regulator output voltage adjustment signal ($S_{LDO\_CAL}$) is incremented and the VCO frequency adjustment signal ($S_F$) is set to zero (18T) to decrease the frequency of the VCO output clock ($F_{VCO}$), and further the level determination signal ($S_{COM}$) is determined (18M).

In the case where the level determination signal ($S_{COM}$) is 1 and the VCO frequency adjustment signal ($S_F$) is not the maximum value (NO in 18N), the VCO frequency adjustment signal ($S_F$) is incremented to increase the frequency of the VCO output clock ($F_{VCO}$) (18O), and then the level determination signal ($S_{COM}$) is further determined (18M).

In the case where the VCO frequency adjustment signal ($S_F$) is the maximum value (YES in 18N) and the regulator output voltage adjustment signal ($S_{LDO\_CAL}$) is the minimum value (YES in 18Q), the calibration processing shifts to the error state and ends abnormally (18I).

In the case where the VCO frequency adjustment signal ($S_F$) is the maximum value (YES in 18N) and the regulator output voltage adjustment signal ($S_{LDO\_CAL}$) is not the minimum value (NO in 18Q), the regulator output voltage adjustment signal ($S_{LDO\_CAL}$) is decremented and the VCO frequency adjustment signal ($S_F$) is set to zero (18R), and further the level determination signal ($S_{COM}$) is determined (18M).

According to the second modified example, the PLL is not needed to be the open loop during calibration. Therefore, calibration can be performed in the normal operating state of the PLL.

Third Embodiment

Next, an interface device according to a third embodiment of the present invention will be described with reference to FIGS. 13 and 14.

Figure 13:
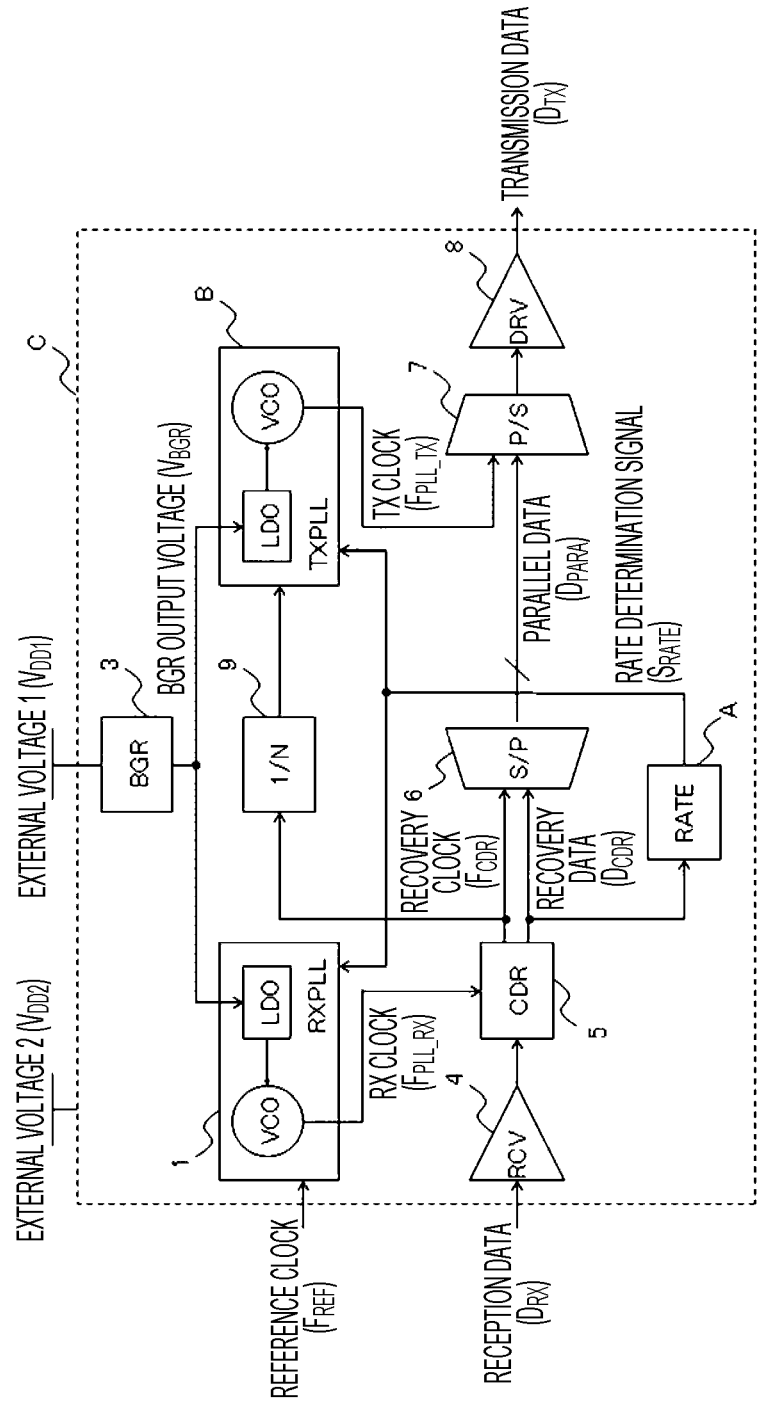
FIG. 13 is an explanatory block diagram for a configuration of an interface device according to a third embodiment.

FIG. 13 is an explanatory block diagram for a configuration of the interface device according to the third embodiment.

An interface device C of the present embodiment includes a receiver 4, a clock data recovery (CDR) 5, a band gap reference 3, a reception PLL (RXPLL) 1, a serial/parallel converter 6, a parallel/serial converter 7, a frequency dividing circuit 9, a transmission PLL (TXPLL) B, a rate controller (RATE) A, and a driver (DRV) 8, and has a function to generate transmission data ($D_{TX}$) obtained by shaping waveforms of degraded reception data ($D_{RX}$).

The receiver 4 receives the reception data ($D_{RX}$). The clock data recovery (CDR) 5 generates recovery data ($D_{CDR}$) and a recovery clock ($F_{CDR}$) from an output signal of the receiver 4 having received the data. The RXPLL 1 receives a reference clock ($F_{REF}$) and BGR output voltage ($V_{BGR}$) that is output voltage of the BGR 3, and supplies an RX clock ($F_{PLL\_RX}$) to the CDR 5. The serial/parallel converter 6 applies parallel conversion to the recovery data ($D_{CDR}$) by using the recovery clock ($F_{CDR}$), and generates parallel data ($D_{PARA}$).

The parallel/serial converter 7 converts the parallel data ($D_{PARA}$) to serial data, and generates transmission data. The driver (DRV) 8 amplifies a signal output from the parallel/serial converter 7, and generates the transmission data ($D_{TX}$). The frequency dividing circuit 9 divides a frequency of the recovery clock ($F_{CDR}$) to one-$N^{th}$, and supplies the same to the TXPLL B. The TXPLL B receives the signal output from the frequency dividing circuit 9 as a reference clock, and also receives the BGR output voltage ($V_{BGR}$), and then supplies a TX clock ($F_{PLL\_TX}$) to the parallel/serial converter 7.

The RXPLL 1 and the TXPLL B include an LDO and a LCVCO of above-described embodiments. The LDO and the LCVCO used in the RXPLL 1 and the TXPLL B are any one of the above-described embodiments.

The rate controller (RATE) A extracts a rate determination signal ($S_{RATE}$) from the recovery data ($D_{CDR}$), and transmits the same to the RXPLL 1 and the TXPLL B, and then controls an output clock frequencies of the RXPLL 1 and the TXPLL B.

Meanwhile, the interface device C of the third embodiment may be preferably implemented on a semiconductor integrated circuit.

Adjustment operation for a transmission speed of the interface device C according to the third embodiment will be described with reference to FIGS. 13 and 14.

The reception data ($D_{RX}$) includes a signal to set a data rate. The interface device C extracts the signal to set the data rate from the reception data ($D_{RX}$), and changes the data rate so as not to hinder communication.

Figure 14:
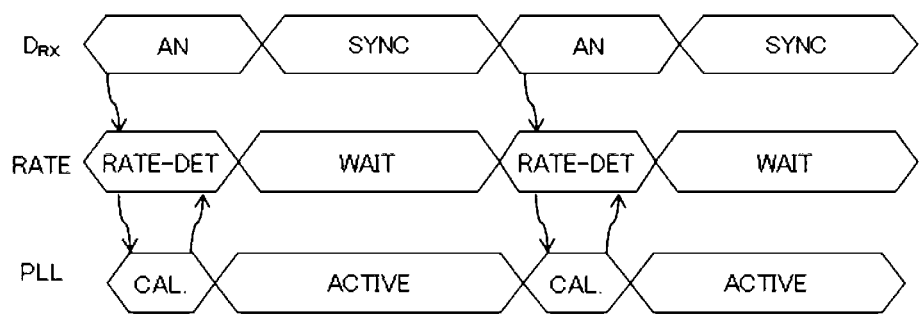
FIG. 14 is a timing chart to describe adjustment operation for a transmission speed of the interface device according to the third embodiment.

As illustrated in FIG. 14, the reception data ($D_{RX}$) is formed of data (SYNC) and a data rate setting signal (AN: Auto Negotiation) used to set the data rate. Since a data rate of the data rate setting signal (AN) is determined, the interface device C can receive the data rate setting signal (AN).

When the interface device C receives the data rate setting signal (AN), the rate controller (RATE) A analyzes the data rate setting signal (AN) from the recovery data ($D_{CDR}$), and determines a required data rate. The rate controller (RATE) A determines the rate determination signal ($S_{RATE}$), and transmits the same to the RXPLL 1 and the TXPLL B such that the interface device C operates at the determined data rate.

When the RXPLL 1 and the TXPLL B receive the rate determination signal ($S_{RATE}$), calibration to change the frequencies of the RX clock ($F_{PLL\_RX}$) and the TX clock ($F_{PLL\_TX}$) is started. The RXPLL 1 and the TXPLL B perform calibration by using the PLL of the second embodiment (including first modified example and second modified example).

As described above, the interface device C according to the third embodiment is capable of handling a plurality of data rates at low cost.

Note that the present invention is not limited to the above-described embodiments and various modified examples and equivalent configurations may be included within the gist in the scope of claims attached herewith. For example, the above-described embodiments are described in detail to clearly explain the present invention in an easy-to-understand manner, and are not necessarily limited to that including all of the configurations that have been described. Further, a part of the configuration of a certain embodiment can be replaced with a configuration of another embodiment. Also, a configuration of another embodiment can be added to a configuration of a certain embodiment. Further, addition, deletion, and substitution of other configurations can be made to a part of the configurations of the respective embodiments.

Furthermore, each of the configurations, functions, processing units, processing means and so forth described above may be implemented either entirely or in part, for example, by hardware by designing an integrated circuit. Also, each of the configurations, functions and so forth may be implemented by software in accordance with a processor interpreting and executing a program that implements the respective functions.

The programs to implement the respective functions, and information such as programs, tables and files can be stored in a recording device such as a memory, a hard disk, a solid state drive (SSD) or in a recording medium such as an IC card, an SD card or a DVD.

In addition, control lines and information lines considered to be required for description are shown and all of control lines and information lines required for implementation are not necessarily shown. Actually, almost all structures may be considered to be mutually connected.

The invention claimed is:

1. A resonator configured to be supplied with voltage from a constant-voltage source, wherein
the constant-voltage source includes a bandgap voltage reference and a regulator that is supplied with a voltage adjustment signal configured to cause the constant-voltage source to output, to the resonator, output voltage adjusted by the voltage adjustment signal,
the resonator outputs a clock signal having a frequency varied by varying capacitance in accordance with a received control signal and a frequency adjustment signal, and
a frequency of the clock signal is varied by voltage output from the constant-voltage source.

2. The resonator according to claim 1, wherein
the resonator includes two inductances, the capacitance, and two transistors,
the voltage supplied from the constant-voltage source is received in first terminals of the respective inductances,
the capacitance is connected to a position between second terminals of the two inductances,
the respective transistors receive signals from the second terminals of the inductances and are connected to the two inductances such that a reverse phase signal is received from the second terminal of the inductance on the opposite side,
other terminals of the respective transistors are connected to the ground, and
the clock signal is output from the second terminal of at least one of the inductances.

3. A phase-locked loop configured to output a signal having a predetermined frequency, and including a phase comparator, a charge pump, a loop filter, a resonator, a constant-voltage source, and a frequency divider, wherein
the frequency divider sets a frequency dividing number by a frequency dividing number setting signal,
the phase comparator compares a feedback clock output from the frequency divider with a received reference clock and outputs a phase difference signal,
the resonator receives the phase difference signal as control voltage via the charge pump and the loop filter, and controls a frequency and a phase of an output signal to predetermined values,
the constant-voltage source includes a bandgap voltage reference and a regulator that receives an output voltage adjustment signal determined from the reference clock and a rate determination signal, such that the constant voltage source adjusts output voltage to be applied to the resonator, and
the resonator performs adjustment based on a frequency adjustment signal determined from the reference clock and the rate determination signal and also based on output voltage output from the constant-voltage source such that a clock signal to be output has a predetermined frequency.

4. A phase-locked loop configured to output a signal having a predetermined frequency, and including a phase comparator, a charge pump, a loop filter, a resonator, a constant-voltage source, and a frequency divider, wherein
the frequency divider sets a frequency dividing number by a frequency dividing number setting signal,
the phase comparator compares a feedback clock output from the frequency divider with a received reference clock and outputs a phase difference signal,
the resonator receives the phase difference signal as control voltage via the charge pump and the loop filter, and controls a frequency and a phase of an output signal to predetermined values,
the constant-voltage source receives an output voltage adjustment signal determined from the reference clock and a rate determination signal, and adjusts output voltage to be applied to the resonator,
the resonator performs adjustment based on a frequency adjustment signal determined from the reference clock and the rate determination signal and also based on output voltage output from the constant-voltage source such that a clock signal to be output has a predetermined frequency, the frequency divider sets the frequency dividing number by using the rate determination signal as the frequency dividing number setting signal, the resonator receives the phase difference signal as control voltage via the charge pump, the loop filter, and the selector, and the logic unit is configured to:
   determine the output voltage adjustment signal and the frequency adjustment signal based on an output signal of the frequency divider, the reference clock, and the rate determination signal such that a clock signal output from the resonator has a predetermined frequency;
   output the determined output voltage adjustment signal to the constant-voltage source; and,
   output the determined frequency adjustment signal to the resonator.

5. A phase-locked loop configured to output a signal having a predetermined frequency, and including a phase comparator, a charge pump, a loop filter, a resonator, a constant-voltage source, and a frequency divider, wherein
the frequency divider sets a frequency dividing number by a frequency dividing number setting signal,
the phase comparator compares a feedback clock output from the frequency divider with a received reference clock and outputs a phase difference signal,
the resonator receives the phase difference signal as control voltage via the charge pump and the loop filter, and controls a frequency and a phase of an output signal to predetermined values,
the constant-voltage source receives an output voltage adjustment signal determined from the reference clock and a rate determination signal, and adjusts output voltage to be applied to the resonator,
the resonator performs adjustment based on a frequency adjustment signal determined from the reference clock and the rate determination signal and also based on output voltage output from the constant-voltage source such that a clock signal to be output has a predetermined frequency,
the phase locked loop further comprises a look-up table,
the frequency divider sets the frequency dividing number by a frequency dividing number setting signal output from the look-up table, and
the look-up table is configured to:
   determine the output voltage adjustment signal, the frequency adjustment signal, and the frequency dividing number setting signal based on the reference clock and the rate determination signal such that a clock signal output from the resonator has a predetermined frequency;
   output the determined output voltage adjustment signal to the constant-voltage source;
   output the determined frequency adjustment signal to the resonator; and
   output the determined frequency dividing number setting signal to the frequency divider.

6. A phase-locked loop configured to output a signal having a predetermined frequency, and including a phase comparator, a charge pump, a loop filter, a resonator, a constant-voltage source, and a frequency divider, wherein
the frequency divider sets a frequency dividing number by a frequency dividing number setting signal,
the phase comparator compares a feedback clock output from the frequency divider with a received reference clock and outputs a phase difference signal,
the resonator receives the phase difference signal as control voltage via the charge pump and the loop filter, and controls a frequency and a phase of an output signal to predetermined values,
the constant-voltage source receives an output voltage adjustment signal determined from the reference clock and a rate determination signal, and adjusts output voltage to be applied to the resonator,
the resonator performs adjustment based on a frequency adjustment signal determined from the reference clock and the rate determination signal and also based on output voltage output from the constant-voltage source such that a clock signal to be output has a predetermined frequency,
wherein the phase locked loop further comprises a comparator and a logic unit,
the frequency divider sets the frequency dividing number by a frequency dividing number setting signal output from the logic unit,
the comparator determines a voltage value of control voltage received in the resonator by using predetermined threshold voltage, and outputs a level determination signal to the logic unit, and
the logic unit is configured to:
   determine the output voltage adjustment signal, the frequency adjustment signal, and the frequency dividing number setting signal based on the level determination signal, the reference clock, and the rate determination signal such that a clock signal output from the resonator has a predetermined frequency;
   output the determined output voltage adjustment signal to the constant-voltage source;
   output the determined frequency adjustment signal to the resonator; and
   output the determined frequency dividing number setting signal to the frequency divider.

7. A semiconductor integrated circuit device comprising:
a phase-locked loop comprising first and second clock generators, and including a reception circuit, the first clock generator, a clock separation circuit, the second clock generator, a rate controller, and a transmission data generation circuit, wherein
the phase-locked loop is configured to output a signal having a predetermined frequency, and including a phase comparator, a charge pump, a loop filter, a resonator, a constant-voltage source, and a frequency divider,
the frequency divider sets a frequency dividing number by a frequency dividing number setting signal,
the phase comparator compares a feedback clock output from the frequency divider with a received reference clock and outputs a phase difference signal,
the resonator receives the phase difference signal as control voltage via the charge pump and the loop filter, and controls a frequency and a phase of an output signal to predetermined values,
the constant-voltage source receives an output voltage adjustment signal determined from the reference clock and a rate determination signal, and adjusts output voltage to be applied to the resonator,
the resonator performs adjustment based on a frequency adjustment signal determined from the reference clock and the rate determination signal and also based on output voltage output from the constant-voltage source such that a clock signal to be output has a predetermined frequency, the reception circuit receives received reception data, the first clock generator generates a reception clock by using received reference clock, and outputs the reception clock to the clock separation circuit, the clock separation circuit extracts a recovery clock and recovery data from the reception data by using the generated reception clock, the second clock generator generates a transmission clock by using, as a reference clock, a signal obtained by dividing a frequency of the recovery clock by the frequency divider, the transmission data generation circuit converts recovery data, by using the generated transmission clock, to transmission data having a rate different from the reception data, and the rate controller outputs a rate determination signal that is adjusted in accordance with rate information of the reception data extracted from the recovery data such that clock signals output from the first and second clock generators have predetermined frequencies.

\* \* \* \* \*